(12) United States Patent
Simion

(10) Patent No.: US 8,211,501 B2
(45) Date of Patent: Jul. 3, 2012

(54) FLUORINATION PRE-TREATMENT OF HEAT SPREADER ATTACHMENT INDIUM THERMAL INTERFACE MATERIAL

(75) Inventor: Bogdan M. Simion, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/907,006

(22) Filed: Oct. 18, 2010

(65) Prior Publication Data
US 2011/0092026 A1 Apr. 21, 2011

Related U.S. Application Data

(62) Division of application No. 11/618,905, filed on Dec. 31, 2006, now Pat. No. 7,829,195.

(51) Int. Cl.
*C23C 16/40* (2006.01)
*H05H 1/24* (2006.01)

(52) U.S. Cl. ............ 427/255.31; 427/255.39; 427/569; 427/576

(58) Field of Classification Search ............ 427/255.31, 427/255.39, 569, 576
See application file for complete search history.

(56) References Cited

U.S. PATENT DOCUMENTS

| | | | |
|---|---|---|---|
| 3,907,607 A | 9/1975 | Chu et al. | |
| 4,492,181 A | 1/1985 | Ovshinsky et al. | |
| 5,071,486 A | 12/1991 | Chasteen | |
| 5,205,461 A | 4/1993 | Bickford et al. | |
| 5,346,520 A | 9/1994 | Meabon et al. | |
| 5,380,557 A | 1/1995 | Spiro | |
| 5,539,248 A | 7/1996 | Abrokwah et al. | |
| 5,609,290 A | 3/1997 | Bobbio et al. | |
| 6,552,296 B2 | 4/2003 | Smith et al. | |
| 6,617,611 B2 | 9/2003 | Hasegawa et al. | |
| 7,243,833 B2 | 7/2007 | Arana et al. | |
| 7,319,048 B2 | 1/2008 | Lu et al. | |
| 7,362,580 B2* | 4/2008 | Hua et al. ............ | 361/709 |
| 7,534,715 B2 | 5/2009 | Jadhav et al. | |
| 7,829,195 B2 | 11/2010 | Simion | |
| 2002/0100972 A1 | 8/2002 | Kitajima et al. | |
| 2003/0178474 A1 | 9/2003 | Jiang et al. | |
| 2004/0031962 A1 | 2/2004 | Hasegawa et al. | |

(Continued)

OTHER PUBLICATIONS

Deppisch, Carl, et al., "The Material Optimization and Reliability Characterization of an Indium-Solder Thermal Interface Material for CPU Packaging". JOM, Jun. 2006, pp. 67-74.*

*Primary Examiner* — Bret Chen
(74) *Attorney, Agent, or Firm* — Konrad Raynes & Victor LLP; Alan S. Raynes

(57) ABSTRACT

The formation of electronic assemblies including a heat spreader coupled to a die through a thermal interface material formed from an indium preform, is described. One embodiment relates to a method including providing a preform comprising indium, the preform including an indium oxide layer thereon. The method also includes exposing the preform to fluorine so that part of the indium oxide layer is transformed into an indium oxy-fluoride. The method may also include, after the exposing the preform to fluorine so that part of the indium oxide layer is transformed into an indium oxy-fluoride, positioning the preform between a die and a heat sink, and applying pressure to and heating the preform positioned between the die and the heat sink so that reflow occurs and a bond is formed between the die and the heat sink.

22 Claims, 4 Drawing Sheets

U.S. PATENT DOCUMENTS

| | | |
|---|---|---|
| 2004/0067613 A1 | 4/2004 | Murofushi et al. |
| 2004/0074952 A1 | 4/2004 | Stipp et al. |
| 2006/0011217 A1 | 1/2006 | McDermott et al. |
| 2007/0051774 A1 | 3/2007 | Stipp et al. |
| 2007/0152321 A1 | 7/2007 | Shi et al. |
| 2008/0142729 A1 | 6/2008 | Chen |
| 2008/0153210 A1* | 6/2008 | Hua et al. .................. 438/122 |
| 2008/0156635 A1 | 7/2008 | Simon |

* cited by examiner

Fig. 6
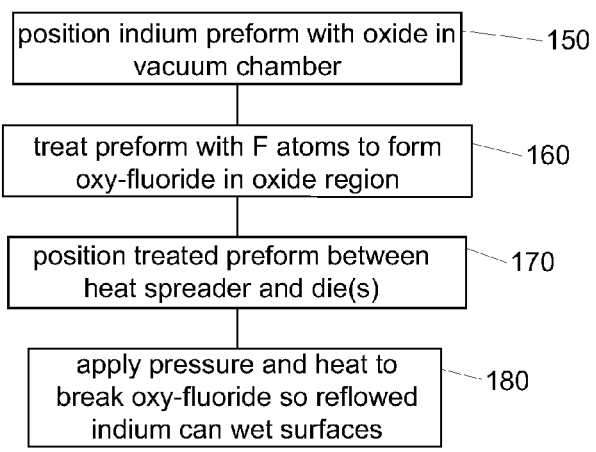
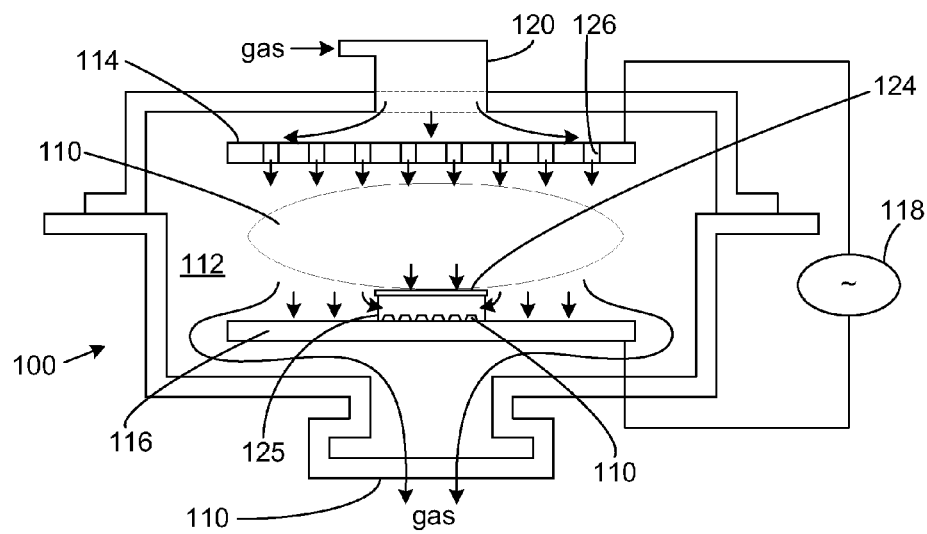
Fig. 7(A)
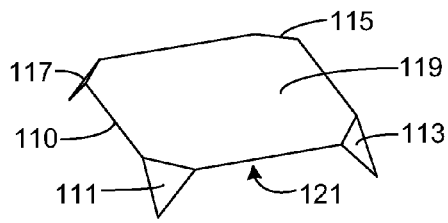
Fig. 7(B)

FLUORINATION PRE-TREATMENT OF HEAT SPREADER ATTACHMENT INDIUM THERMAL INTERFACE MATERIAL

This application is a divisional of prior U.S. application Ser. No. 11/618,905, U.S. Pat. No. 7,829,195, filed Dec. 31, 2006, which is hereby incorporated by reference in its entirety.

RELATED ART

Integrated circuits may be formed on semiconductor wafers that are formed from materials such as silicon. The semiconductor wafers are processed to form various electronic devices thereon. The wafers are diced into semiconductor chips, which may then be attached to a package substrate using a variety of known methods.

Operation of the integrated circuit generates heat in the device. As the internal circuitry operates at increased clock frequencies and/or higher power levels, the amount of heat generated may rise to levels that are unacceptable unless some of the heat can be removed from the device. Heat is conducted to a surface of the chip (also known as a die), and should be conducted or convected away to maintain the temperature of the integrated circuit below a predetermined level for purposes of maintaining functional integrity of the integrated circuit.

One way to conduct heat from a die is through the use of a heat spreader, which is a body thermally coupled to the die. The heat spreader may be positioned above the die and thermally coupled to the die through a thermal interface material. Materials such as certain solders may be used as a thermal interface material and to couple the heat spreader to the die. A flux is typically applied to at least one of the surfaces to be joined and the surfaces brought into contact. The flux acts to remove the oxide on the solder surfaces to facilitate solder wetting. The thermal interface material may be initially be a solid perform that is positioned between the heat spreader and die. A heating operation at a temperature greater than the melting point of the thermal interface material is carried out, and a connection is made between the die and the heat spreader through the thermal interface material.

BRIEF DESCRIPTION OF THE DRAWINGS

Embodiments are described by way of example, with reference to the accompanying drawings, which are not drawn to scale, wherein:

FIG. 6 is a flow chart of certain operations for treating a thermal interface material perform and forming an assembly including a heat spreader bonded to at least one die through the thermal interfaced material, in accordance with certain embodiments;

FIG. 7(A) illustrates an instrument for treating an indium preform, in accordance with certain embodiments;

FIG. 7(B) illustrates a portion of an indium preform that may be processed in the instrument illustrated in FIG. 7(A), in accordance with certain embodiments;

DETAILED DESCRIPTION

Certain embodiments relate to the formation of electronic assemblies. Certain embodiments also relate to the pre-treatment of an indium thermal interface material. Certain embodiments also relate to a fluxless attach processes for forming connections between a die and a heat spreader.

Figure 1:
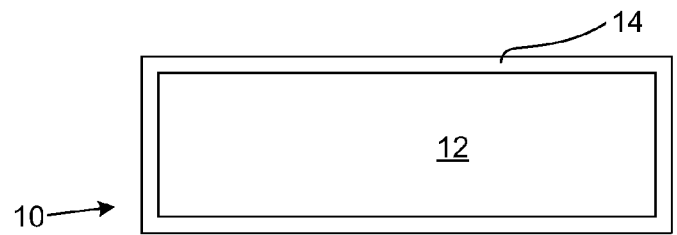
FIG. 1 illustrates an indium preform having a native oxide thereon, in accordance with certain embodiments.

FIG. 1 illustrates an indium body 10, also known as a preform, which may be used as a thermal interface material in accordance with certain embodiments. The indium preform 10 may in certain embodiments includes a core region of indium (In) and a native oxide layer 14 on its surface formed from exposure of the indium to oxygen. The oxide layer 14 protects the core region 12 from further oxidation. The oxide layer 14 is strongly bound to the underlying core region 12. As a result, while carrying out heating of the indium preform 10 during a reflow operation for attaching a heat spreader to a die, during the transition from solidus to liquidus of the indium preform 10, the native oxide layer 14 maintains its solid state, creating a barrier between the liquid indium and the surfaces it needs to bond to. To overcome this problem, a variety of chemical agents may be used as fluxes to remove the native oxide layer and promote bonding. The volatiles present in these fluxes have been identified as a principal source of voids created during the reflow operation and thus the fluxes are responsible for an inefficient transfer of thermal energy from the active areas of the die to the thermal heat spreader.

Figure 2:
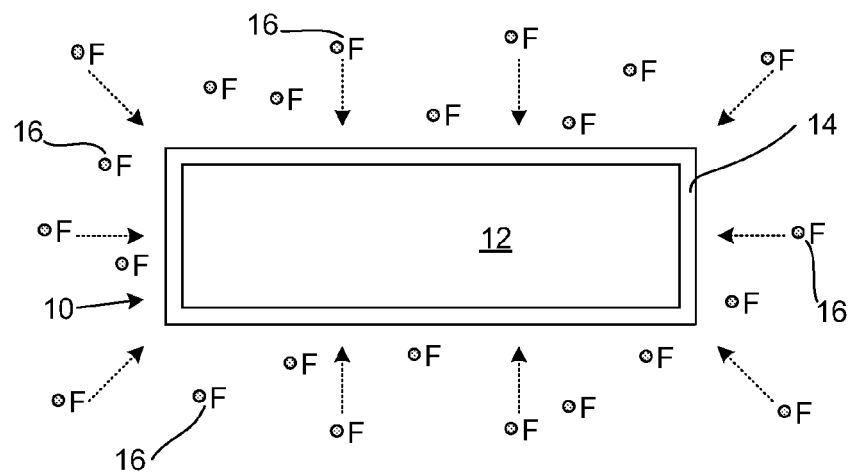
FIG. 2 illustrates treating the indium preform of FIG. 1 with fluorine atoms, in accordance with certain embodiments.

FIG. 2 illustrates an embodiment in which the indium body 10 is treated prior to placing the indium body between a die and a heat spreader. The treatment includes exposure to highly reactive fluorine (F) species in atomic form 16, in a controlled vacuum atmosphere, such that the fluorine does not react with oxygen or hydrogen in an open atmosphere. Atoms of fluorine 16 are directed towards the indium body 10. A variety of fluorine sources may be used. Due to the toxicity of fluorine, benign fluoride gases, for example, $CF_4$ and $SF_6$, may be used to initiate the process. These gases are used to generate the fluorine atoms in the controlled environment, the release being activated by, for example, a microwave induced plasma.

Figure 3:
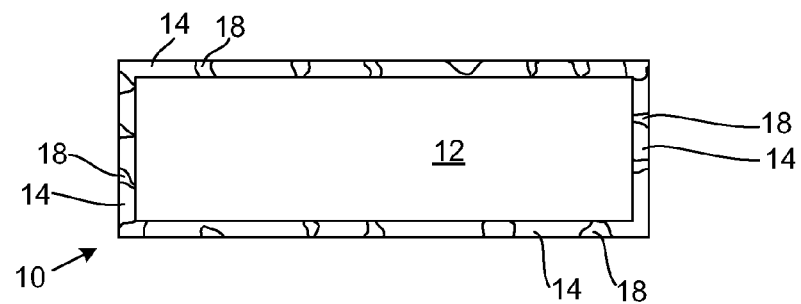
FIG. 3 illustrates the formation of oxy-fluoride regions in the native oxide of the indium preform, in accordance with certain embodiments.

Exposing the indium oxide to the fluorine results in the formation of an oxy-fluoride on the surface. In certain embodiments, the treatment is controlled so that at least part of the native oxide is transformed into an oxy-fluoride and a portion of the native oxide is not transformed. FIG. 3 illustrates an embodiment including an indium preform 10 including the formation of areas of oxy-fluoride 18 within the native oxide layer 14. As seen in FIG. 3, the areas of oxy-fluoride 18 may be surrounded by native oxide 14. The oxy-fluoride 18 has a relatively high melting temperature but is brittle. As a result, when a suitable force is applied, at a temperature lower that its melting point, the oxy-fluoride can be broken (due to its brittleness), and the indium core 12 positioned under the oxy-fluoride 18 can then be exposed.

In certain embodiments, it is believed that a native oxide layer will reform on an oxy-fluoride region within about a week when stored in an air environment. When stored in an inert environment, it is believed that it will take a longer time for a native oxide to form on the oxy-fluoride region. For example, in a nitrogen environment, it is believed that a native oxide layer will form on the oxy-fluoride region within about two weeks. Thus, in such embodiments, the use of the indium preform as a thermal interface material, to couple a heat spreader to a die, should be carried out within these times.

Figure 4:
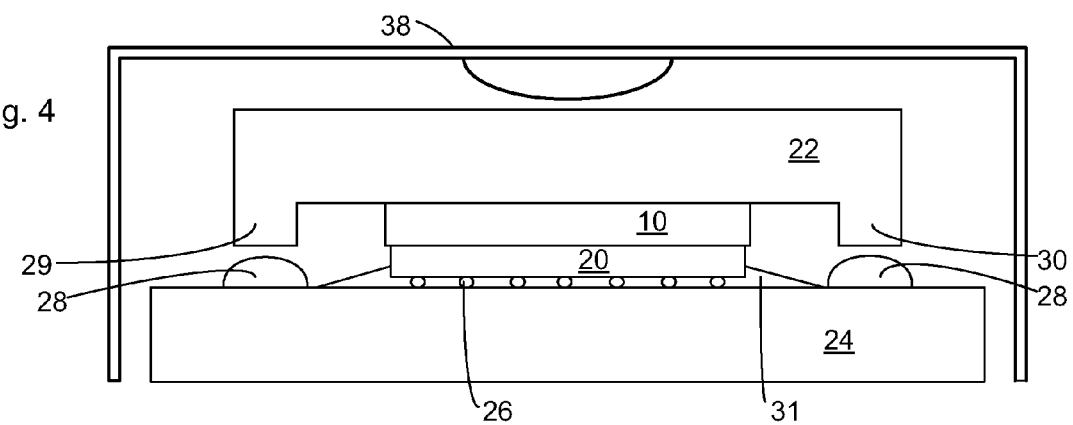
FIG. 4 illustrates a treated indium preform positioned between a die and a heat spreader, in accordance with certain embodiments.

As illustrated in FIG. 4, the indium preform 10 having the oxy-fluoride 18 on the surface may be positioned between a die 20 and a heat spreader 22. The heat spreader 22 may be formed from a variety of materials, including, but not limited to, copper (Cu), and in certain embodiments may include one or more metallization layers formed thereon, such as nickel, which may act as a wetting layer, and gold, which may act to protect the nickel layer from oxidation.

The die 20 may in certain embodiments have a flip-chip configuration with an active die surface facing a package substrate 24 and a back side surface facing the indium preform 10 (the thermal interface material). The back side surface of the die 20 may include a suitable back side metallization (BSM) that may provide oxidation protection and promote the bonding of the die 20 to the indium thermal interface material. In certain embodiments, the back side metallization includes one or more suitable metal layers, for example, titanium (Ti), nickel (Ni) or nickel vanadium (NiV), and gold (Au).

The die 20 may be coupled to the package substrate 24 through, for example, solder bumps 26, and a suitable die underfill material 31, for example, a curable epoxy, may be present. A sealant material 28, which may in certain embodiments be formed from a polymer, may also be formed on the package substrate 24 surface. As illustrated in FIG. 4, the heat spreader 26 may include leg regions 29, 30 that will be positioned on the sealant 32 to form a lid over the die 20 coupled to the substrate 24.

A suitable clip mechanism 38 may be used to hold and apply a suitable force F to the heat spreader 22, package substrate 24, and the indium preform 10 positioned therebetween during the heating operation. In certain embodiments, the clamp or clip mechanism 38 is coupled to a carrier (not shown) which holds the substrate 24. The assembly is then heated to a temperature sufficient to reflow the indium core 12. In certain embodiments, the reflow operation can be conducted either in a standard air atmosphere or a nitrogen controlled atmosphere. The reflow of the indium preform 10 may in certain embodiments be carried out at a temperature that is lower than the melting point of the solder bumps 26.

Figure 5:
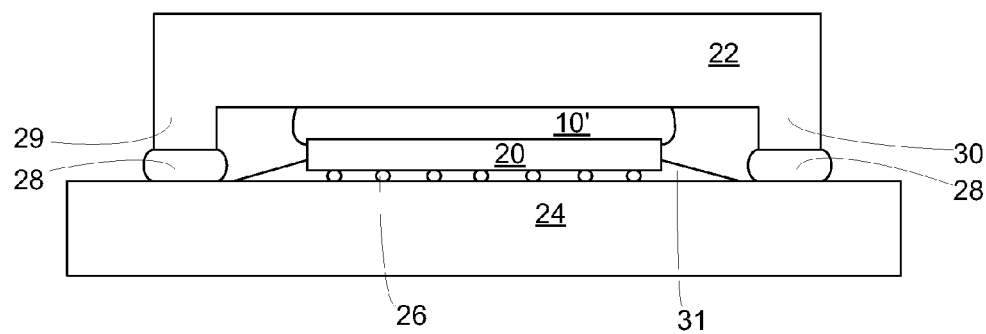
FIG. 5 illustrates the formation of a joint with an indium thermal interface material positioned between a die and a heat spreader, in accordance with certain embodiments.

It is believed that the combination of the heat and pressure breaks down the brittle oxy-fluoride regions 18 and permits the indium core 12 of the indium preform 10 to flow and wet the surfaces of the die 20 and heat spreader 22 to form a strong bond therebetween. A flux need not be used, so void formation from flux residue is inhibited. FIG. 5 illustrates an assembly after the heating operation including the heat spreader 22 coupled to the die 24 through the thermal interface material 10', which includes the reflowed indium preform 10. The joint between the thermal interface material 10' and the thermal heat spreader 22, and the joint between the thermal interface material 10' and the die 20, may include material from the indium preform 10 and material from any of the various layer(s) on the heat spreader 22 and die 20, as describe above. Depending on the elements used in the various layers, the finished joint may include a number of layers, including various combinations of the elements used. Some of the combinations may comprise alloys and some may comprise intermetallic compounds. For example, where indium is used in the thermal interface material, and one or more gold layers are used, the joint will in certain embodiments include one or more indium-gold alloys and one or more indium-gold intermetallic compounds. Assemblies including a substrate, die, thermal interface material and thermal spreader formed and joined together as described in embodiments above may find application in a variety of electronic components. Such components may include, but are not limited to, processors, controllers, chipsets, memory, and wireless devices.

FIG. 6 is a flow chart showing a number of operations in accordance with certain embodiments. Box 150 is positioning in a vacuum chamber an indium preform having an indium core surrounded by a native oxide layer. Box 160 is treating the indium preform by exposing the indium preform to fluorine atoms, to transform at least a portion of the native oxide layer to an oxy-fluoride layer. Box 170 is positioning the treated indium preform between a heat spreader and one or more dies. The heat spreader is adapted to transmit heat away from the one or more dies, with the indium acting as a thermal interface material. Box 180 is applying pressure and heat to the assembly including the indium preform positioned between the heat spreader and die(s), so that the oxy-fluoride breaks down and indium in the core melts and wets the heat spreader and die to form a bond therebetween. A flux is not needed to make the bond between the treated indium preform and the heat spreader.

FIG. 7(A) illustrates an example of a system 100 for performing a fluorine treatment of one or more indium preforms 110, in accordance with certain embodiments. The system 110 includes a vacuum chamber 112 having an anode 114 and a cathode 116 positioned therein. In certain embodiments the anode may be formed from stainless steel and the cathode may be formed from carbon. A power source such as an RF power source 118 is connected to the anode 114 and cathode 116. A gas intake and flow regulator 120 may be positioned at a top portion of the system 110. A gas containing fluorine (for example, $CF_4$ and/or $SF_6$) is delivered through the gas intake and flow regulator 120 and into the chamber 112. The gas may travel through apertures 126 extending through the anode 114 and towards the middle of the chamber 112. A plasma may be generated between the anode 114 and the cathode 116 in the plasma generation region 122.

A plurality of indium preforms 110 are positioned on the cathode 116. A masking cover 124 is positioned over the indium preforms 110. The masking cover 124 may in certain embodiments be formed from stainless steel, and includes side supports 125 that are configured to permit gas to flow under the upper portion of the masking cover 124. The masking cover 124 acts to inhibit the indium preforms 110 from direct contact with the plasma. Reactive ions ejected from the plasma may reach the preforms 110 from the sides, below the masking cover 124. Fluorine ions will react with the indium oxide surface of the indium preforms 10 and form oxy-fluoride regions in the indium oxide surface. The system 110 may in certain embodiments be configured so that the vacuum is generated by pumping in a downward direction as indicated by the arrows extending downward through the bottom of the vacuum chamber 112 as illustrated in FIG. 7(A). Such a configuration enables gas atoms to make their way to the bottom of the vacuum chamber 112 and be transmitted therefrom.

To permit both the top surface 119 and the bottom surface 121 of the indium preforms 110 to be reacted with the fluorine ions, in certain embodiments the indium preforms 110 have their corners bent as illustrated in FIG. 7(B), so that the four corners 111, 113, 115, 117 act as legs and thus the bottom surface 19 is exposed. After the treatment the corners may then be bent back to flatten the indium preform 110.

Figure 8:
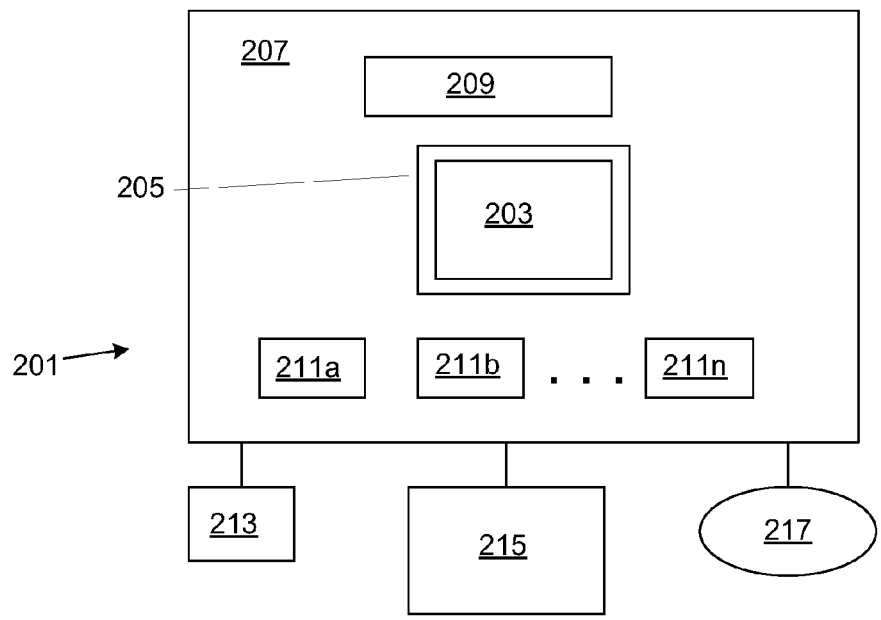
FIG. 8 illustrates an electronic system arrangement in which certain embodiments may find application.

Assemblies including a substrate, die, thermal interface material and heat spreader formed and joined together as described in embodiments above may find application in a variety of electronic components. FIG. 8 schematically illustrates one example of an electronic system environment in which aspects of described embodiments may be embodied. Other embodiments need not include all of the features specified in FIG. 8, and may include alternative features not specified in FIG. 8.

The system 201 of FIG. 8 may include at least one central processing unit (CPU) 203. The CPU 203, also referred to as a microprocessor, may be a die which is attached to an integrated circuit package substrate 205, which is then coupled to a printed circuit board 207, which in this embodiment, may be a motherboard. The CPU 203 on the package substrate 205 is an example of an electronic device assembly that may have a structure formed in accordance with embodiments such as described above. A variety of other system components, including, but not limited to memory and other components discussed below, may also include assembly structures formed in accordance with the embodiments described above.

The system 201 further may further include memory 209 and one or more controllers 211a, 211b . . . 211n, which are also disposed on the motherboard 207. The motherboard 207 may be a single layer or multi-layered board which has a plurality of conductive lines that provide communication between the circuits in the package 205 and other components mounted to the board 207. Alternatively, one or more of the CPU 203, memory 209 and controllers 211a, 211b . . . 211n may be disposed on other cards such as daughter cards or expansion cards. The CPU 203, memory 209 and controllers 211a, 211b . . . 211n may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 211a, 211b . . . 211n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed is:

1. A method for processing a body comprising indium, comprising:
    providing a body comprising indium, the body including an indium oxide layer on a surface thereof;
    exposing the body to fluorine and forming regions of indium oxy-fluoride on the surface; and
    stopping the exposing the body to fluorine so that the surface includes regions of indium oxy-fluoride and regions of indium oxide.

2. The method of claim 1, wherein the exposing the body to fluorine includes introducing a gas comprising fluorine into a plasma chamber, forming a plasma of the fluorine gas to generate fluorine ions, and exposing the body to a plurality of the fluorine ions.

3. The method of claim 2, wherein the gas comprising fluorine is selected from the group consisting of $CF_4$ and $SF_6$.

4. The method of claim 2, further comprising positioning a masking cover between the plasma and the body to inhibit direct contact between the plasma and the body.

5. The method of claim 4,
    wherein the masking cover includes sides; and
    wherein the masking cover is sized and positioned to permit gas flow around the sides thereof, including permitting reactive ions ejected from the plasma to reach the body.

6. The method of claim 1, further comprising, after the stopping the exposing the body to fluorine so that the surface includes regions of indium oxy-fluoride and regions of indium oxide;
    positioning the body between a die and a heat spreader; and
    heating the body, in the absence of a flux, and forming a bond between the die and the heat spreader.

7. The method of claim 6, wherein the heating the body in carried out in air.

8. The method of claim 6, wherein the heating the body in carried out in nitrogen.

9. A method for forming an electronic device, comprising:
    providing a preform comprising indium, the preform including an indium oxide layer thereon;
    exposing the preform to fluorine so that part of the indium oxide layer is transformed into indium oxy-fluoride;
    stopping the exposing the preform to fluorine so that an outer surface of the preform includes regions of indium oxy-fluoride and regions of indium oxide;
    after the exposing the preform to fluorine, positioning the preform between a die and a heat spreader; and
    after the positioning the preform between the die and the heat spreader, applying pressure to and heating the preform so that reflow occurs and a bond is formed between the die and the heat spreader.

10. The method of claim 9, wherein prior to the positioning the preform between the die and the heat spreader, the die is coupled to a substrate using a plurality of solder bumps; and wherein the heating the preform so that reflow occurs is carried out at a temperature that is lower than the melting point of the solder bumps.

11. The method of claim 10, wherein prior to the positioning the preform between the die and the heat spreader, an epoxy material is positioned between the die and the substrate and cured.

12. The method of claim 10, wherein the heat spreader is configured to be a lid that covers the die.

13. The method of claim 12, wherein the heating the preform is carried out in at atmosphere selected from the group consisting of air and nitrogen.

14. The method of claim 10, wherein the heat spreader includes end regions, and method further comprises positioning a sealant material between end regions of the heat spreader and the substrate.

15. The method of claim 9, wherein the heating the preform is carried out in the absence of a flux.

16. The method of claim 15, wherein the gas comprising fluorine is selected from the group consisting of $CF_4$ and $SF_6$.

17. The method of claim 9, wherein the exposing the preform to fluorine includes introducing a gas comprising fluorine into a plasma chamber, forming a plasma of the fluorine gas to generate fluorine ions, and exposing the preform to a plurality of the fluorine ions.

18. A method comprising:
providing an indium body, the indium body including a core comprising indium surrounded by a surface layer comprising indium oxide, the core and surface layer having different chemical compositions;
generating fluorine ions from a plasma;
exposing the indium body to a plurality of the fluorine ions to form regions of indium oxy-fluoride; and
stopping the exposing the indium body to the plurality of the fluorine ions so that the surface layer includes regions of indium oxide and regions of indium oxyfluoride.

19. The method of claim 18, further comprising:
positioning the indium body between a die and a heat spreader, the indium body including the surface layer regions of indium oxide and indium oxyfluoride; and
after the positioning the indium body, applying pressure to and heating the indium body so that reflow of the indium occurs and a bond is formed between the die and the heat spreader.

20. The method of claim 18, further comprising:
positioning additional indium bodies adjacent to the indium body, the additional indium bodies each including a core comprising indium surrounded by a surface layer comprising indium oxide, the core and surface layer having different chemical compositions;
exposing each of the additional indium bodies to a plurality of the fluorine ions to form regions of indium oxy-fluoride; and
stopping the exposing the each of the additional indium bodies to the plurality of the fluorine ions so that the surface layer includes regions of indium oxide and regions of indium oxy-fluoride.

21. The method of claim 20, further comprising providing a masking cover having sides, the masking cover being positioned and sized to permit fluorine ions to flow around the sides thereof to contact the indium body and the additional indium bodies.

22. The method of claim 18, further comprising positioning a masking cover between the indium body and the plasma, the masking cover including sides, the masking cover being positioned and sized to permit fluorine ions to flow around the sides thereof.

* * * * *